United States Patent [19]

Takita

[11] Patent Number: 4,550,387
[45] Date of Patent: Oct. 29, 1985

[54] CIRCUIT FOR DETECTING THE OCCURRENCE OF A PLURALITY OF SIGNALS IN A PREDETERMINED SEQUENCE

[75] Inventor: Kentaro Takita, Tokyo, Japan

[73] Assignee: Sony/Tektronix Corporation, Tokyo, Japan

[21] Appl. No.: 695,425

[22] Filed: Jan. 28, 1985

Related U.S. Application Data

[63] Continuation of Ser. No. 404,193, Aug. 2, 1982, abandoned.

[30] Foreign Application Priority Data

Dec. 15, 1981 [JP] Japan .............................. 56-201784

[51] Int. Cl.⁴ ..................... G06F 3/00; H03K 21/00
[52] U.S. Cl. .................................. 364/900; 377/55
[58] Field of Search ................. 382/10; 377/54, 55; 364/200 MS File, 900 MS File

[56] References Cited

U.S. PATENT DOCUMENTS

| | | | |
|---|---|---|---|
| 3,930,142 | 12/1975 | Meier | 377/55 |
| 4,040,025 | 8/1977 | Morrill, Jr. et al. | 364/900 |
| 4,099,048 | 7/1978 | Eichenlaub | 377/54 |
| 4,250,562 | 2/1981 | Haag et al. | 364/900 |
| 4,301,513 | 11/1981 | Haag et al. | 364/900 |
| 4,303,987 | 12/1981 | Haag et al. | 364/900 |
| 4,475,237 | 10/1984 | Glasby | 382/10 |
| 4,490,847 | 12/1984 | Aleksander et al. | 382/10 |

*Primary Examiner*—Harvey E. Springborn
*Attorney, Agent, or Firm*—Francis I. Gray; Allston L. Jones

[57] ABSTRACT

A circuit detects that a plurality of signals are generated in a predetermined sequence. The plurality of signals are applied to address terminals of a memory which has stored therein a predetermined pattern, and a divide-by-N counter (N:positive integer) counts a first data output signal from the memory N times and applies a carry output signal generated as a result thereof to another address terminal of the memory. An output signal of the circuit is derived from a second data output terminal of said memory when the plurality of input signals occur in the predetermined pattern of the memory and the carry signal from the counter is applied to the memory.

9 Claims, 10 Drawing Figures

| SIGNAL | A | B | C | | | | | |
|---|---|---|---|---|---|---|---|---|
| TERMINAL | A4 | A3 | A2 | A1 | A0 | D0 | D1 | D2 |
| (1) | 0 | 0 | 0 | 0 | 0 | 0 | 0 | 0 |
| (2) | 1 | 0 | 0 | 0 | 0 | 1 | 0 | 0 |
| (3) | 0 | 1 | 0 | 0 | 1 | 0 | 1 | 0 |
| (4) | 0 | 0 | 1 | 1 | 1 | 0 | 0 | 1 |

| SIGNAL | A | B | C | | | | | |
|---|---|---|---|---|---|---|---|---|
| TERMINAL | A4 | A3 | A2 | A1 | A0 | D0 | D1 | D2 |
| (1) | 0 | 0 | 0 | 0 | 0 | 0 | 0 | 0 |
| (2) | 0 | 1 | 0 | 0 | 0 | 1 | 0 | 0 |
| (3) | 0 | 0 | 1 | 0 | 1 | 0 | 1 | 0 |
| (4) | 1 | 0 | 0 | 1 | 1 | 0 | 0 | 1 |

| SIGNAL | A | B | C | | | | | | |
|---|---|---|---|---|---|---|---|---|---|
| TERMINAL | A4 | A3 | A2 | A1 | A0 | D0 | D1 | D2 | D3 |
| (1) | 0 | 0 | 0 | 0 | 0 | 0 | 0 | 0 | 0 |
| (2) | 1 | 0 | 0 | 0 | 0 | 1 | 0 | 0 | 0 |
| (3) | X | 0 | X | 0 | 1 | 0 | 0 | 1 | 0 |
| (4) | 0 | 1 | 0 | 0 | 1 | 0 | 1 | 0 | 0 |
| (5) | X | X | 0 | 1 | 1 | 0 | 0 | 1 | 0 |
| (6) | 0 | 0 | 1 | 1 | 1 | 0 | 0 | 0 | 1 |

FIG. 8

| SIGNAL   | A  | B  | C  | FL | TG | CE | NI | DL | LT |
|----------|----|----|----|----|----|----|----|----|----|
| TERMINAL | A4 | A3 | A2 | A1 | A0 | D0 | D1 | D2 | D3 |
| (1)      | 0  | 0  | 0  | 0  | 0  | 0  | 0  | 0  | 0  |
| (2)      | 1  | 0  | 0  | 0  | 0  | 1  | 0  | 0  | 0  |
|          |    |    |    |    |    |    |    |    |    |
| (3)      | 0  | 1  | 0  | 1  | 0  | 0  | 0  | 1  | 0  |
| (4)      | X  | X  | X  | 0  | 1  | 1  | 0  | 0  | 0  |
|          |    |    |    |    |    |    |    |    |    |
| (5)      | X  | X  | X  | 1  | 1  | 0  | 0  | 0  | 1  |
| (6)      | X  | X  | 1  | 0  | 0  | 0  | 1  | 0  | 0  |
| (7)      | X  | X  | 1  | 1  | 0  | 0  | 1  | 0  | 0  |

FIG. 9

| SIGNAL<br>TERMINAL | A<br>A4 | B<br>A3 | C<br>A2 | FL<br>A1 | TG<br>A0 | CE<br>D0 | NI<br>D1 | DL<br>D2 | LT<br>D3 |
|---|---|---|---|---|---|---|---|---|---|
| (1)  | O | O | O | O | O | O | O | O | O |
| (2)  | I | O | O | O | O | I | O | O | O |
| (3)  | O | I | O | O | O | O | O | O | O |
| (4)  | I | I | O | O | O | I | O | O | O |
| (5)  | O | O | I | O | O | O | I | O | O |
| (6)  | I | O | I | O | O | I | O | O | O |
| (7)  | O | I | I | O | O | O | I | O | O |
| (8)  | I | I | I | O | O | I | O | O | O |
| (9)  | O | O | O | I | O | O | O | O | O |
| (10) | I | O | O | I | O | O | O | O | O |
| (11) | O | I | O | I | O | O | O | I | O |
| (12) | I | I | O | I | O | O | O | I | O |
| (13) | O | O | I | I | O | O | I | O | O |
| (14) | I | O | I | I | O | O | I | O | O |
| (15) | O | I | I | I | O | O | O | I | O |
| (16) | I | I | I | I | O | O | O | I | O |
| (17) | X | X | X | O | I | I | O | O | O |
| (18) | X | X | X | I | I | O | O | O | I |

CIRCUIT FOR DETECTING THE OCCURRENCE OF A PLURALITY OF SIGNALS IN A PREDETERMINED SEQUENCE

This is a continuation of application Ser. No. 404,193 filed Aug. 2, 1982 and now abandoned.

BACKGROUND OF THE INVENTION

The present invention relates generally to a circuit for detecting a predetermined sequence of a plurality of signals, more specifically to a sequence trigger circuit for a logic analyzer.

A circuit of the present invention has many applications, one of which is as an element of a logic analyzer.

Logic analyzers are widely used for development, maintenance and troubleshooting of digital apparatus. FIG. 1 is a block diagram of a typical logic analyzer, wherein comparator 12 receives through probe 10 a parallel digital input signal (digital word) consisting of a plurality of bits. Comparator 12 compares the digital input signal with a predetermined level to adjust the logic level of the input signal to a level which is the same as that of the following stages (those blocks to the right of comparator 12 as shown in FIG. 1), the output signal from comparator 12 being applied to acquisition memory 14 and trigger circuit 16. Trigger circuit 16 detects a desired phenomenon (that is, a word pattern) from the input signal, and generates a write stop signal when the word pattern is detected. This write stop signal is then applied to acquisition memory 14 through acquisition control circuit 17 to stop acquiring the signal in acquisition memory 14. Thus, acquisition memory 14 may store the input signal generated before the desired word pattern. Bus 18 (for transmitting data, address and control signals) has connected thereto a central processing unit (CPU) 20, such as a microprocessor, a read only memory (ROM) 22, a random access memory (RAM) 24, a display RAM 26, a keyboard 28, a clock signal generator 30, acquisition memory 14, trigger circuit 16 and acquisition control circuit 17. CPU 20 controls the entire system by using RAM 24 as a temporary memory in accordance with firmware of ROM 22. Display RAM 26 is connected to display device 32 such as a cathode ray tube, keyboard 28 acts as an external input device to enter and set data for trigger circuit 16 or the like, a control signal, an output command of the acquired data, etc., by an operator. Clock signal generator 30 applies a predeterminated clock signal to each block. An example of such a logic analyzer is Tektronix Model 7D02 Logic Analyzer the operation of which is described in the user's manual therefore.

It is important for such logic analyzers, and other devices, to detect that a plurality of digital signals are generated in a predetermined sequence for development, maintenance and troubleshooting purposes. For this end, a word recognizer detects the desired word from the input signal. Assuming that the desired words are, for example, A, B and C, a signal sequence detection circuit may generate the output signal (write stop signal) when the words are generated in order of A, B and C or B, C and A. In addition, the detection circuit may generate the output signal, when the word A is generated N times, the word B is generated one time, and the clock signal is counted M times before the word C occurs. The word recognizer and the signal sequence detection circuit are included in trigger circuit 16 of the logic analyzer. The signal sequence detection circuit may be useful for many kinds of electronic apparatus including logic analyzers. Since a conventional signal sequence detection circuit consists of a complex combination circuit including logic gates, counters, etc., it is expensive and complex in construction. Moreover, the conventional circuit is not easily adapted to different detection patterns of the signal sequence.

SUMMARY OF THE INVENTION

According to the present invention, a signal sequence detection circuit consists of a memory and at least one divide-by-N counter (N:positive integer) with an output latch function. The divide-by-N counter generates the output when N input pulses are applied. The memory stores a desired pattern to determine a signal sequence, and receives a plurality of digital signals at address terminals. The counter counts an output from a data terminal of the memory, and applies the latched output to an address terminal of the memory. When a desired first digital signal is applied to a predetermined address terminal of the memory, the contents of the predetermined address are accessed to generate the output from a predetermined data terminal. When the counter counts the output from the predetermined data terminal of the memory for N times, the counter generates the output which is latched. This latched output from the counter means that the first digital signal has occurred N times. Since the memory receives the latched output from the counter at the address terminal, the memory detects a desired second digital signal generated thereafter. This operation is repeated until a plurality of digital signals are detected as being generated in a predetermined sequence. It is easy to change a detection pattern of the signal sequence, because this pattern depends only on the contents of the memory and the N of the counter.

It is, therefore, an object of the present invention to provide a circuit for detecting a signal sequence which is simple in construction, inexpensive in manufacture, and easy to change a detection pattern of the signal sequence.

It is another object to provide a circuit for detecting a signal sequence which is suitable for a trigger circuit of a logic analyzer.

The present invention is pointed out with particularity in the appended claims. Other objects and advantages will become apparent to those having ordinary skill in the art upon a reading of the following description when taken in conjunction with the accompanying drawings.

BRIEF DESCRIPTION OF THE DRAWINGS

A full understanding of the present invention will be obtained from the detailed description and the accompanying drawings, which are given by way of illustration only, and thus are not limitative of the present invention, and wherein:

FIG. 8 is s state table for explaining the output signal generation of FIG. 7 for the input signal sequence ABC;

FIG. 9 is state table for explaining the output signal generation of FIG. 7 for the signal sequence ABC;

DETAILED DESCRIPTION OF THE PREFERRED EMBODIMENT

Figure 1:
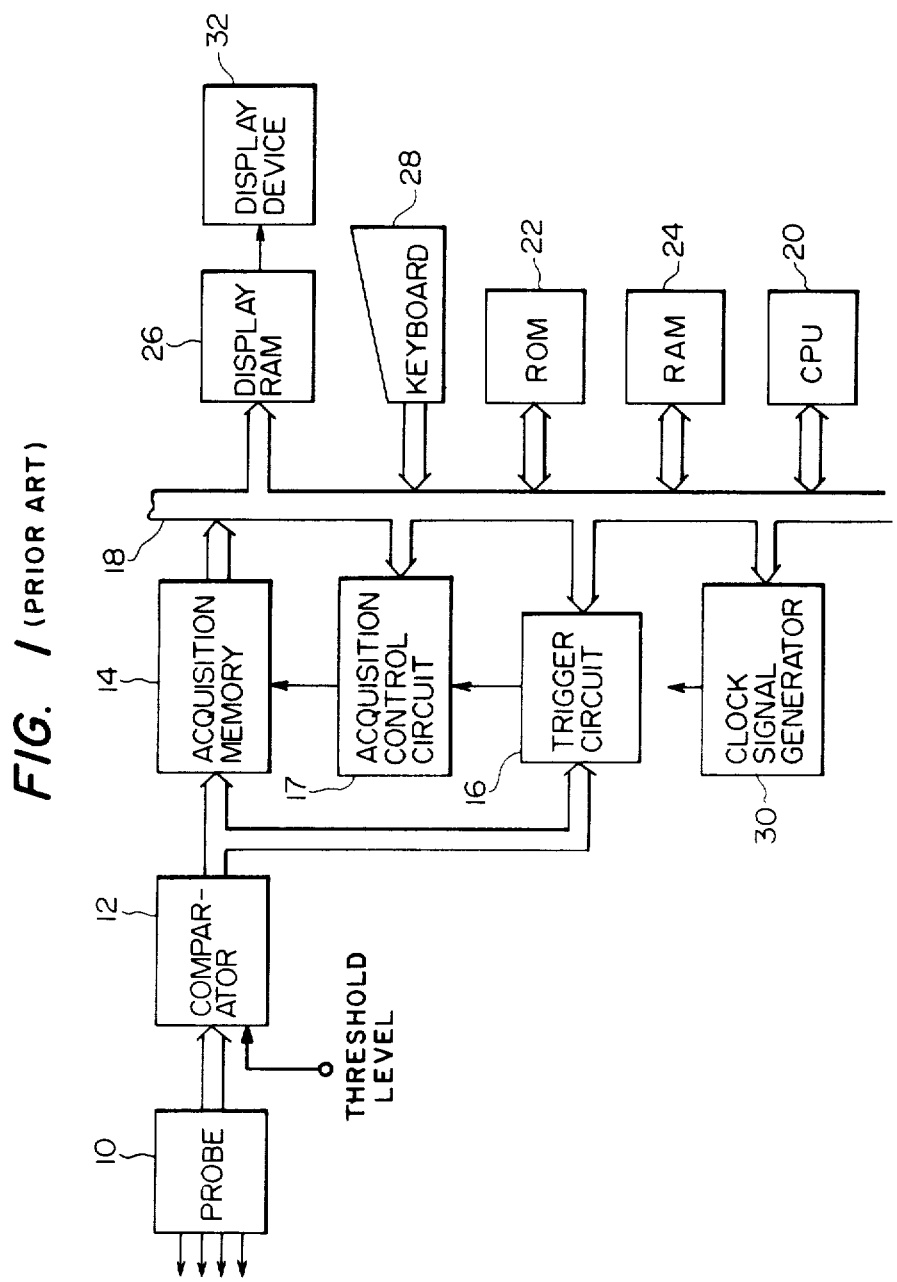
FIG. 1 is a block diagram of a prior art logic analyzer which might employ the present invention.
Figures 2, 3, 4:
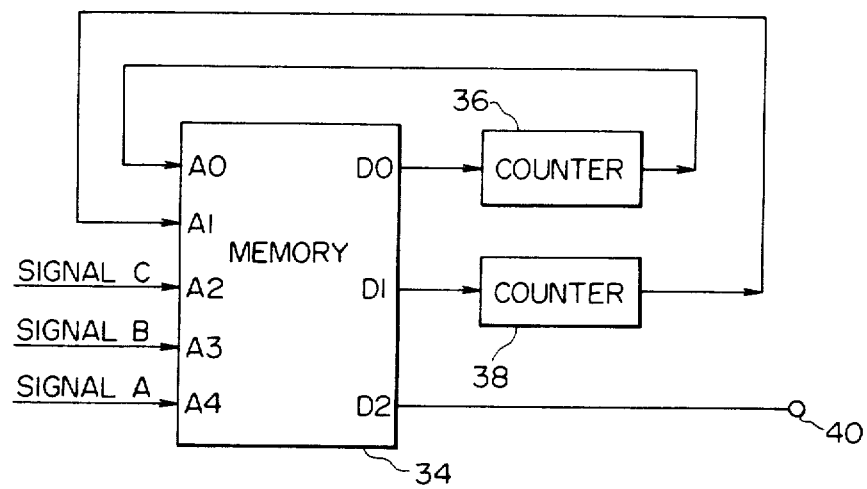
FIG. 2 is a block diagram of one embodiment according to the present invention.
FIG. 3 is a state table for explaining the output signal generation of FIG. 2 for the input signal sequence ABC.
FIG. 4 is a state table for explaining the output signal generation of FIG. 2 for the input signal sequence BCA.

Referring to FIG. 2, a block diagram of a first embodiment according to the present invention is illustrated. As described hereinbefore, the present invention may be used, for example, in the trigger circuit 16 of FIG. 1.

FIG. 2 will be discussed by reference to signal generation tables of FIGS. 3 and 4. Address signal input terminals A4, A3 and A2 of memory 34, such as a random access memory (RAM) receive, respectively, output digital signals A, B and C from a word recognizer, and the other address signal input terminals A0 and A1 receive, respectively, the output signals from divide-by N (N:desired positive integer) counters 36 and 38 each having a latching function of its output signal (e.g. a 54LS161 modulo N counter followed by a D flip-flop), namely, a hold function. The signals A, B and C are generated when the word recognizer detects the words A, B and C, respectively. Data signal output terminals D0, D1 and D2 of memory 34 are respectively connected to input terminals of counters 36 and 38 and output terminal 40. In this specification, descriptions "a signal is generated" and "a signal is applied" mean that a digital signal "1" is generated and applied, respectively.

Assume that the counter number (N), of counters 36 and 38, is set to one, and a signal is generated at output terminal 40 when the signals A, B and C are applied to the input terminals A4, A3 and A2 in this order. Memory 34 stores the data in each address as shown in FIG. 3. Initially, the output signals from counters 36 and 38 are "0", i.e., the input terminals A0 and A1 receive "0". When all the input signals to the input terminals A0 through A4 are "0", all the output signals from the output terminals D0 through D2 are "0" as shown in FIG. 3(1). When the signal A is generated (FIG. 3(2)), only the output terminal D0 of the output terminals D0 through D2 generates "1" which is applied to counter 36. Since the N is 1, counter 36 applies "1" to the input terminal A0 and holds this state. When the signal B is generated (i.e., "1" is applied to the input terminal A3) in this state, the input terminals A0 through A4 receive the signals as shown in FIG. 3(3). Under this input condition, only the output terminal D1 generates "1" and applies it to counter 38, so that counter 38 applies "1" to the input terminal A1 and holds this state because of N=1. Thus, both of the input terminals A0 and A1 receive "1". When the signal C is generated in this condition (FIG. 3(4)), only the output terminal D2 generates "1". In other words, the circuit of FIG. 2 detects that the signals A, B and C are generated in this sequence. By applying the signal at the output terminal D2 to acquisition memory 14 of FIG. 1 through output terminal 40 and acquisition control circuit 17 to stop the signal acquisition of memory 14, a desired portion of the input signal may be stored. If counters 36 and 38 are reset when "1" appears at output terminal 40, the signal sequence detection of the signals A, B and C is repeated again.

As described hereinbefore, the counter number (N) of counters 36 and 38 is set to one. However, the output terminal D2 can apply "1" to output terminal 40 after the signal A is generated P times, the signal B is generated M times and the signal C is applied, if the count numbers of counters 36 and 38 are respectively set to "P" and "M". In the above description, "1" is generated at the output terminal 40 only when the signals A, B and C are generated in this sequence (i.e., any signal of the signals A, B and C does not appear between the signals A and B, and the signals B and C). However, it is obvious that a similar operation will be repeated, even if the signals A, B and C are generated sporadically in this sequence, i.e., the signal C is generated once or a plurality of times after the signal A, the signal B is generated, and the signal A is generated once or a plurality of times before occurrence of the signal C. If at least two of the words A, B and C are generated simultaneously, memory 34 may store the data in consideration of this condition.

For generating the signal from the output terminal D2 when the signals A, B and C are generated in the sequence of B, C and A, the contents of memory 34 are changed as shown in FIG. 4. This change is accomplished under control of CPU 20, the firmware of ROM 22 and keyboard 28 in FIG. 1. Similarly the count number (N) of counters 36 and 38 is set to "1", and the output signals from counters 36 and 38 are "0" in the initial condition, i.e., the input terminals A0 and A1 receive "0". When all the input signals of the input terminals A0 through A4 are "0", all the output signals from the output terminals D0 through D2 are "0" as shown in FIG. 4(1). Firstly, the signal B is generated (FIG. 4(2)), only the output terminal D0 of the terminals D0 through D2 generates "1". Counter 36 applies "1" to the input terminal A0 and holds this condition because of N=1. When the signal C is generated (i.e., the input terminal A2 receives "1") in this condition, the input terminals A0 through A4 receive the signals as shown in FIG. 4(3). After this input condition, counter 38 (N=1) applies "1" to the input terminal A1 and holds this condition, since only the output terminal D1 generates "1". Thus, both the input terminals A0 and A1 receive "1". When the signal A becomes "1" in this condition (FIG. 4(4)), only the output terminal D2 of the terminals D0 through D2 applies the output to output terminal 40 indicative of the fact that the signals are generated in the sequence of the signals B, C and A. If counters 36 and 38 are reset when "1" occurs at output terminal 40 similarly to the first embodiment, it is repeated to detect the signal sequence of the signals B, C and A. The present invention is available similarly to FIG. 3 for applying "1" from the output terminal D2 to output terminal 40 when the signal B is generated P times, when the signal C is generated M times, when the signal A is generated, and when the signals B, C and A are sporadically generated in this sequence.

In FIGS. 3 and 4, it is possible to provide a counter between the output terminals D2 and 40 and set the count number thereof to L so as to generate "1" at output terminal 40 after the last signal C (FIG. 3) or the last signal A (FIG. 4) is generated L times, wherein the signals C and A make the output terminal D2 generate the signal "1".

Figures 5, 6:
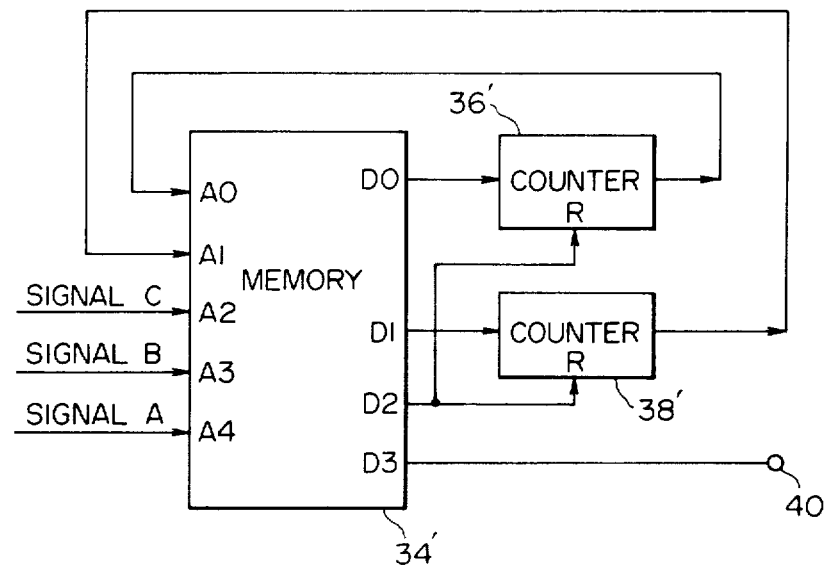
FIG. 5 is a block diagram of another embodiment according to the present invention.
FIG. 6 is a state table for explaining the output signal generation of FIG. 5 for the input signal sequence ABC.

FIG. 5 is a block diagram of another embodiment according to the present invention. This embodiment is similar to the embodiment of FIG. 2, however, memory 34' includes four data signal output terminals D0 through D3, and divide-by N counters 36' and 38' include reset terminals R. The output terminal D2 of memory 34' is connected to the reset terminals R of counters 36' and 38', and the output terminal D3 is connected to output terminal 40. The embodiment of FIG. 2 detects whether signals A, B and C are generated continuously or are generated discontinuously in a predetermined sequence. However, the embodiment of FIG. 5 detects whether signals A, B and C are generated only continuously in the predetermined sequence. In other words, if the predetermined sequence is, for example, the signals A, B and C, the second embodiment detects only when no signal is generated between the signals A and B and between the signals B and C. For this end, memory 34' stores data as shown in FIG. 6, wherein "X" means that both "1" and "0" are acceptable.

Similarly to FIG. 2, the count number (N) of counters 36' and 38' are set to one, and both the output signals from counters 36' and 38' are "0" in the initial condition, i.e., the input terminals A0 and A1 receive "0". When all the signals at input terminals A0 through A4 are "0", all the output signals from the output terminals D0 through D3 are "0" as shown in FIG. 6(1). Firstly, the signal A is generated (FIG. 6(2)), only the output terminal D0 of the terminals D0 through D3 generates "1". Since N=1, counter 36' applies "1" to the input terminal A0 and holds this condition. If the signal B is not generated immediately after the condition (FIG. 6(3)), i.e., if the signal(s) A and/or C are (is) generated, or all the signals A and C are not generated (another signal (word) excluding the signals A through C is generated), "1" is generated at the output terminal D2 and counters 36' and 38' are reset to return to the initial condition. When the signal B is generated immediately after the signal A, the input terminals A0 through A4 receive the signals as shown in FIG. 6(4). Since only the output terminal D1 generates "1" in this input condition, counter 38' (N=1) applies "1" to the input terminal A1 and holds this condition. Thus, both the input terminals A0 through A1 receive "1". If the signal C is not generated immediately after this condition (FIG. 6(5)), i.e., if the signal(s) A and/or B are (is) generated, or all the signals A through C are not generated, "1" occurs at the output terminal D2 and counters 36' and 38' are reset to return to the initial condition. When the signal C is generated immediately after the signal B (FIG. 6(6)), only the output terminal D3 of the terminals D0 through D3 applies "1" to output terminal 40 so as to indicate that the signals A, B and C are generated continuously in this sequence. In order to change the detected signal sequence, the contents of memory 34' may be modified. As described hereinbefore by reference to FIG. 2, the signal at the output terminal D3 may reset counters 36' and 38', and a divide-by-N counter may be connected between the output terminals D3 and 40.

Figure 7:
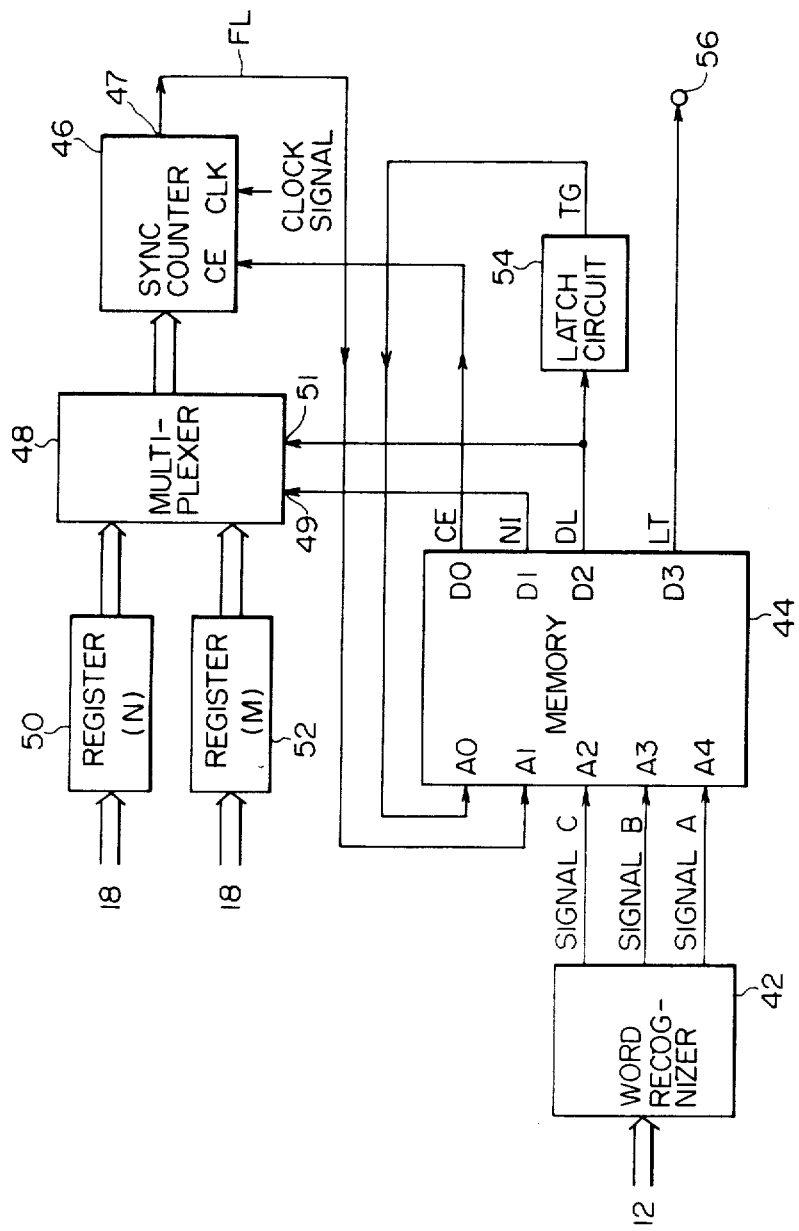
FIG. 7 is a block diagram of a further embodiment according to the present invention.

FIG. 7 is a block diagram of another embodiment according to the present invention which corresponds to trigger circuit 16 of FIG. 1. In FIG. 7, word recognizer 42 receives the word signal from comparator 12 (FIG. 1). Word recognizer 42 consists of gate circuits such as exclusive OR gates, and recognizes the words A, B and C from a sequential word signal in synchronism with a clock signal to apply the signals A, B and C to address signal input terminals A4, A3 and A2 of memory 44 (corresponding to memory 34 of FIG. 2), respectively. A data signal output terminal D0 of memory 44 is connected to a count enable terminal CE of synchronous counter 46 with a clock terminal CLK receiving the clock signal. Since the signals A, B and C are generated by word recognizer 42 in synchronism with the clock signal, memory 44 generates signals at data output terminals D0 through D3 in synchronism with the clock signal. The signal from the output terminal D0 (hereinafter referred to as a signal CE) is a count enable signal generated in synchronism with the clock signal. Sync counter 46 counts the clock signal on receiving the signal CE, and generates a signal "1" (referred to as a signal FL) at terminal 47 after counting a predetermined number. Sync counter 46 holds this condition until a preset number is renewed. The output terminal D1 of memory 44 is connected to input terminal 49 of multiplexer 48 which selects register 50 when receiving the signal "1" (referred to as a signal NI) to apply a count set number N (desired positive integer) from register 50 to sync counter 46 (i.e., sync counter 46 is preset to N). The output terminal D2 of memory 44 is connected to input terminal 51 of multiplexer 48 and latch circuit 54. When multiplexer 48 receives the signal "1" (referred to as a signal DL) from output terminal D2, it selects register 52 to apply a count set number M (desired positive integer) from register 52 to sync counter 46 for presetting sync counter 46 to M. When the signal DL is generated from the output terminal D2, latch circuit 54 applies "1" (referred to as a signal TG) to the input terminal A0 and holds this condition. Registers 50 and 52 are connected to bus 18 of FIG. 1, and N and M are loaded to registers 50 and 52 by the use of CPU 20 and keyboard 28.

The operation of the block diagram of FIG. 7 will be discussed by reference to FIG. 8. The contents of register 50 are loaded into sync counter 46 in the initial condition, and the count number is set to N. Memory 44 stores data in each address as shown in FIG. 8. When the input terminals A0 through A4 receive "0", all the output signals at the output terminals D0 through D3 are "0" as shown in FIG. 8(1). When the signal A is applied to the input terminal A4, "1" (signal CE) is generated only from the output terminal D0 in synchronism with the clock signal (FIG. 8(2)), and sync counter 46 counts one clock signal. If the signal A is further generated (N−1) times (i.e., if the signal A is generated N times in addition to the former one generation of the signal A), sync counter 46 further counts the clock signal (N−1) times and applies "1" (signal FL) from output terminal 47 to the input terminal A1. As described hereinbefore, counter 46 holds this state until the set count number is renewed (refer to A1 of FIG. 8(3)). In other words, sync counter 46 detects that the signal A is generated N times. When the signal B is generated at this state (FIG. 8(3)), "1" (signal DL) is generated at only the output terminal D2. Thus, multiplexer 48 applies the count set number M stored in register 52 to sync counter 46 to preset counter 46 to M, and sync counter 46 applies "0" from output terminal 47 to the input terminal A1. On the other hand, latch circuit 54 produces "1" (signal TG) and holds the state (FIG. 8(4)). After the state of signal TG is set to "1", memory 44 always generates the signal CE, and sync counter 46 counts the clock signal. In the input signal columns of FIG. 8, "X" means that both the signals "0" and "1" are available. When sync counter 46 counts the clock signal M times, it generates "1" (signal FL) at output terminal 47. Since latch circuit 54 generates "1" (signal TG), memory 44 applies the signal "1" (referred as a signal LT) from the output terminal D3 to output terminal 56 (the signal LT is the write stop signal described in the explanation of FIGS. 1 and 2, and is applied to acquisition memory 14 through acquisition control circuit 17 of FIG. 1) as shown in FIG. 8(5), after sync counter 46 applies "1" (signal FL) from output terminal 47 to the input terminal A1. When the signal C is generated in a condition that the input terminals A0 and A1 receive "0" (FIG. 8(6)) or receive "0" and "1" respectively (FIG. 8(7)), "1" (signal NI) is generated only at the output terminal D1 regardless of the signals at the input terminals A3 and A4, so that multiplexer 48 selects register 50 to preset sync counter 46 to N. In other words, if the signal C is generated before the signal A is counted for N times and the signal B is generated, the circuit of FIG. 7 is reset, i.e., sync counter 46 is preset to N again to return to the initial condition and the signal A is counted from the initial state. The above operation is then repeated. Thus, memory 44 applies the output signal to output terminal 56, after the signal A is counted for N times, the signal B is generated and a predetermined period (the clock signal period multiplied by M) passes. The circuit can be reset by the signal C. The logic analyzer of FIG. 1 using the present invention can measure effectively, because it can store the input signal in acquisition memory 14 when the input signal coincides with a desired condition, even if the condition is complex.

In the above description by reference to the signal generation table of FIG. 8, for simplifying the explanation, the signal LT is generated after the signal A is generated N times, the signal B being generated once and the sync counter 46 counting the clock signal M times. The signal generation table of FIG. 9 illustrates a relation between various kinds of the input signals and the output signals. FIG. 9(1) through (8) are conditions before sync counter 46 counts the signal A for N times, since both the input terminals A0 and A1 receive "0". FIG. 9(1) through (8) illustrate the output signal states when the signals A, B and C (one or a plurality of them) are applied in the state indicated. FIG. 9(1) and (2) are the same as FIG. 8(1) and (2), and thereby no description will be made. In FIG. 9(3), the signal B is generated, but all the output signals from the output terminals D0 through D3 are "0" regardless of the signal B, because the input terminals A0 through A1 receive "0" (i.e., sync counter 46 has not as yet counted the signal A for N times yet). In FIG. 9(4), both the signals A and B are generated simultaneously, and "1" (signal CE) is generated at the output terminal D0 in accordance with the signal A to count the signal A, since sync counter 46 did not count the signal A N times. FIG. 9(5) is similar to FIG. 8(6), so that "1" (signal NI) is generated at the output terminal D1 to reset the system of FIG. 7 (i.e., multiplexer 48 transmits N from register 50 to sync counter 46 to preset counter 46 to N). In FIG. 9(6), both the signals A and C are generated simultaneously, and "1" (signal CE) is generated at the output terminal D0. In this instance, the signal A has priority over the signal C. However, the signal C may have priority over the signal A. If so, the outputs are the same as FIG. 9(5). In FIG. 9(7), the signals B and C are generated simultaneously, and thereby "1" (signal NI) is generated at the output terminal D1. In other words, the signal C has priority over the signal B, because sync counter 46 has not yet counted A for N times. In FIG. 9(8), the signals A, B and C are generated simultaneously, and "1" (signal CE) is generated at the output terminal D0 to count the signal A, because the signal A has priority since sync counter 46 did not count the signal A N times. FIG. 9(9) through (16) indicate that the input terminals A1 and A0 are, respectively "1" (signal FL) and "0", i.e., the signal B has not been applied yet, but sync counter 46 has counted the signal A N times and generates "1" (signal FL) from output terminal 47. In FIG. 9(9), all the signals A, B and C are not generated, and all the output signals from the output terminals D0 through D3 are "0". In FIG. 9(10), the signal A is applied, but the generation of the signal A is ignored so that all the output signals from memory 44 are "0", because sync counter 46 has counted the signal A N times already. FIG. 9(11) is the same as FIG. 8(3). In FIG. 9(12), the signals A and B are applied. In this instance, the signal B is wanted, and "1" (signal DL) is generated at the output terminal D2. In FIG. 9(13), the signal C is applied, and "1" (signal NI) is generated at the output terminal D1. However, the signal C may be ignored to make all the output signals from memory 44 be "0". In FIG. 9(14), the signals A and C are applied simultaneously, the signal A is ignored since the sync counter 46 has counted it N times already, and "1" (signal NI) is generated to the output terminal D1 as shown with respect to FIG. 9(13). In FIG. 9(15), the signals B and C are applied simultaneously, and "1" (signal DL) is generated at the output terminal D2 since the signal B is wanted as described hereinbefore. In FIG. 9(16), the signals A, B and C are applied simultaneously, and the signal B has priority similarly to (15). Since FIG. 9(17) and (18) are respectively the same as FIG. 8(4) and (5), no description may be needed. The above description was made for explaining FIG. 9, however, the operator can set the contents of memory 44 to a desired condition previously so that a desired signal may have priority when more than two of the signals A, B and C are generated simultaneously.

Figure 10:
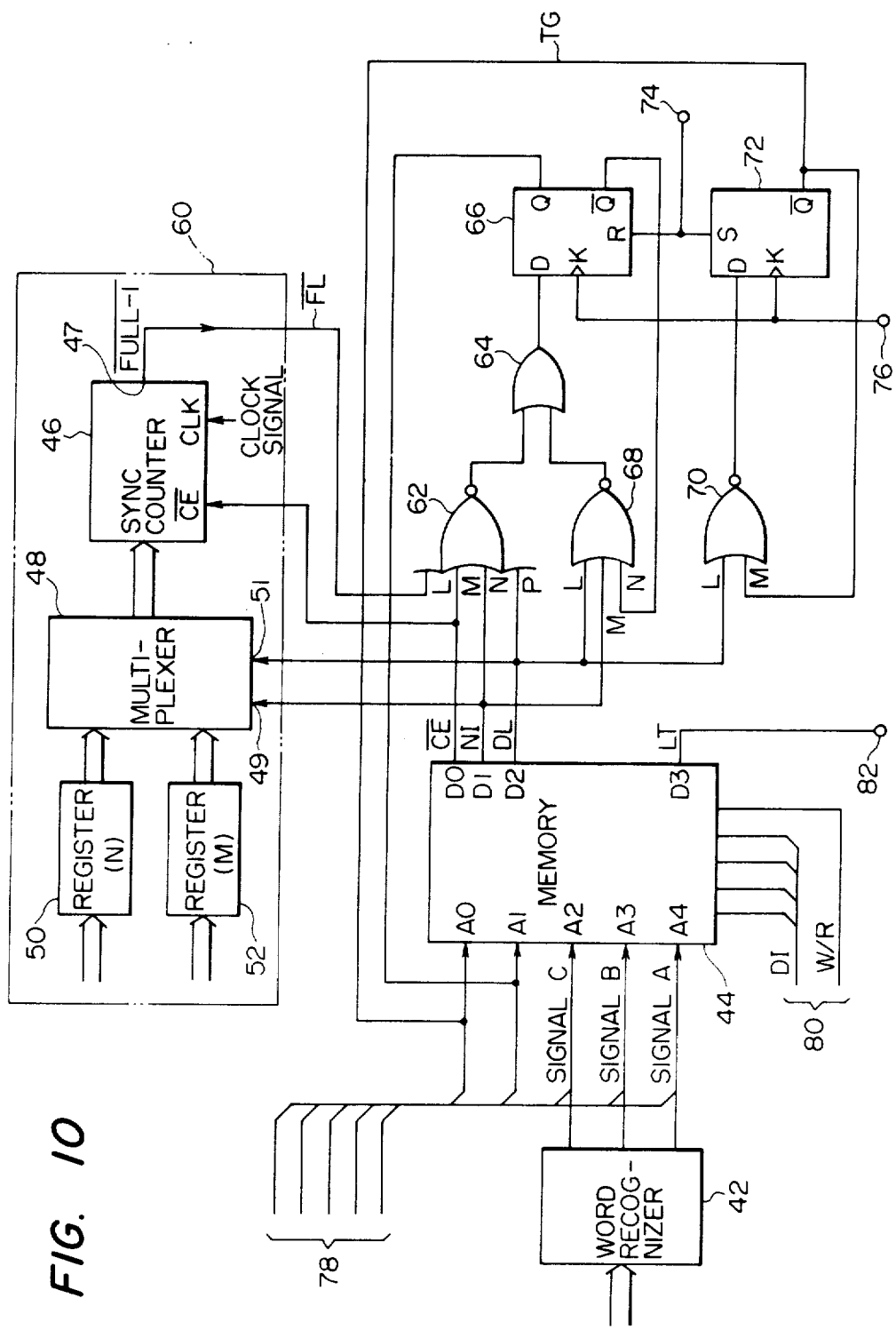
FIG. 10 is a block diagram of an additional embodiment according to the present invention.

FIG. 10 is a circuit diagram of another embodiment according to the present invention which corresponds to trigger circuit 16 of FIG. 1. In the embodiment of FIG. 10, circuit 60 includes sync counter 46, multiplexer 48 and registers 50 and 52, each designed with slow processing speed devices. The slow speed operation of circuit 60 is compensated by providing NOR gate 62, OR gate 64 and D flip-flop 66. The operations of word recognizer 42, memory 44, sync counter 46, multiplexer 48 and registers 50 and 52 in FIG. 10 are similar to those of FIG. 7, however, some parts of FIG. 10 are different from FIG. 7 as follows. The output signal $\overline{CE}$ from the output terminal D0 is inverted, and sync counter 46 applies the signal $\overline{FL}$ (inverted signal of the signal FL) to an input terminal L of NOR gate 62 (illustrated as $\overline{FULL-1}$ in the drawing) after the count value reaches ((count set number)−1). In other words, the output signal from sync counter 46 changes from "1" to "0", when the contents of counter 46 reaches (count set number−1). Similarly to FIG. 7, the output terminal D0 of memory 44 is connected to the count enable terminal CE of sync counter 46 (the inverted signal is applied, and this condition is illustrated by a bar at the top of the characters), and the output terminals D1 and D2 thereof are respectively connected to input terminals 49 and 51 of multiplexer 48. The output terminals D0, D1, and D2 of memory 44 are further connected to input terminals M, N and P of NOR gate 62, respectively. Moreover, the output terminals D1 and D2 are respectively connected to input terminals M and L of NOR gate 68. The output terminals of NOR gates 62 and 68 are connected through OR gate 64 to the D input terminal of D flip-flop 66 with the Q and $\overline{Q}$ output terminals connected to the input terminal A1 of memory 44 and the input terminal N of NOR gate 68, respectively. The output terminal D2 of memory 14 is further connected to the input terminal L of NOR gate 70. The output terminal of NOR gate 70 is connected to the D input terminal of D flip-flop 72 with the $\overline{Q}$ output terminal connected to the input terminal A0 of memory 44 and the input terminal M of NOR gate 70. The reset terminal R of D flip-flop 66 and the set terminal S of D flip-flop 72 receive a reset signal from CPU 20 through terminal 74 to reset and set flip-flops 66 and 72, respectively. The clock terminals K of D flip-flops 66 and 72 receive the clock signal from clock signal generator 30 (FIG. 1) through terminal 76. 78 is a terminal to receive the address signal from CPU 20, and DI and W/R indicated by 80 are terminals to apply the data signal and the write/read command signal from CPU 20 to memory 44. Thus, a pattern is written in memory 44 for detecting a desired signal sequence.

The operation of FIG. 10 will be discussed, wherein the signal LT is generated after the signal A is generated N times, the signal B is generated once and sync counter 46 counts the clock signal for M times similarly to the operation of FIG. 7. "1" is applied to terminal 74 at an initial condition, so that D flip-flop 66 generates "0" and "1" at the Q and $\overline{Q}$ output terminals, and D flip-flop 72 generates "0" at the $\overline{Q}$ output terminal. The input terminal L of NOR gate 62 receives "1" and the input terminals N and P thereof receive "0", before sync counter 46 counts the signal A for N times, the signal A being applied to the input terminal A4 of memory 44. Since NOR gate 62 receives "0" at the input terminal M at every generation of the signal A, the input signals to NOR gate 62 are not determined whether "0" or "1". However, since "1" is applied to the input terminal L of NOR gate 62, the output therefrom is "0". Since D flip-flop 66 generates "1" from the $\overline{Q}$ output terminal, the input terminals L, M and N of NOR gate 68 receive "0", "0" and "1", respectively. Thus, the output from NOR gate 68 is "Q", and the output from OR gate 64 is "0". The output terminal D of D flip-flop 66 receives "0", so that flip-flop 66 maintains "0" and "1" at the output terminals Q and $\overline{Q}$. The input terminals L and M of NOR gate 70 receive "0" and the output signal from NOR gate 70 is "1". Thus, D flip-flop 72 maintains "0" at the output terminal $\overline{Q}$. When sync counter 46 counts the signal A by (N−1) times, the signal $\overline{FL}$ changes from "1" to "0". When memory 44 applies "0" from the output terminal D0 to the input terminal M of NOR gate 62 at the generation of the Nth signal A, NOR gate 62 applies "1" to the D input terminal of D flip-flop 66 through OR gate 64, and the output signals from the output terminals Q and $\overline{Q}$ of D flip-flop 66 become "1" and "0", respectively. Thus, the input terminal A1 of memory 44 receives "1" when the Nth signal A is generated. Since sync counter 46 counts only to (N−1), the low processing speed is not a serious problem. If "1" is generated at the output terminal D0 before the signal A is generated N times and the signal B is generated, it is unfavorable because the output from NOR gate 62 changes from "1" to "0". For improving this unfavorable problem, NOR gate 68 is provided. Since the input terminal N of NOR gate 68 receives "0" from the $\overline{Q}$ output terminal of D flip-flop 66, D flip-flop 66 holds the output signal state until the signal B is generated after the signal A is generated N times. When the signal B is generated after N generations of the signal A, memory 44 generates "1" at the output terminal D2, and the output from NOR gate 68 becomes "0". As a result of this operation, the output signal state of D flip-flop 66 returns to the initial condition, i.e., the output from NOR gate 70 changes to "0" when the output terminal D2 generates "1", D flip-flop 72 generates "1" at the output terminal $\overline{Q}$. Thus, memory 44 receives "0" and "1" at the input terminal A0 and A1, respectively. Sync counter 46 is preset to M, and the signal $\overline{FL}$ changes from "0" and "1". In accordance with the generation of the signal B, memory 44 keeps the signal CE "0", and sync counter 46 starts to count the clock signal as described hereinbefore. The signal $\overline{FL}$ changes from "1" to "0", when counter 46 counts to (M−1). D flip-flop 66 generates "1" and "0" at the output terminals Q and $\overline{Q}$, respectively in response to the generation of the signal $\overline{CE}$ "0" in synchronism with the Mth clock signal after sync counter 46 has started to count the clock signal. Since the output signal from D flip-flop 72 is "1" as described hereinbefore, memory 44 receives "1" at the input terminals A0 and A1. Thus, memory 44 generates "1" at output terminal D3. In this operation, it is not a serious problem that the processing speed of sync counter 46 is slow. If the signal C is applied, sync counter 46 returns to the initial condition similarly to the operation of FIG. 7. A counter may be provided at the next stage of output terminal 82, wherein the count number of the counter is set to L, for generating the output signal after the signal LT is generated L times.

In the foregoing description, three input signals are applied for convenience, however, the present invention can accept four or more input signals.

As understood from the foregoing description, the signal sequence detection circuit of the present invention consists of only a memory and a counter, so that it is simple in construction and is inexpensive to manufacture. Since the signal sequence is changed by modifying the contents of the memory, it is easy to change the detection pattern. The generation number of the detected signal can be controlled by changing the count value (preset value) of the counter. Thus, the present invention is suitable for a logic analyzer to detect a complex combination of the input signals.

Although the above description was made only on preferred embodiments of the present invention, it will be apparent for those skilled in the art that various modifications can be made without departing from the scope and spirit of the present invention. For example, divide-by-N counter may be a D flip-flop with the D input and clock terminals to receive "1" and the output signal from the memory, if the N is one. The memory may be a programmable read only memory (PROM), and the counter may be a synchronous or asynchronous counter. If the contents "1" and "0" of the memory are reversed, the sequence of the signals $\overline{A}$, $\overline{B}$ and $\overline{C}$ can be detected.

The divide-by-N counter having a latch function used in FIGS. 2 and 5 may consist of, for example, custom divide-by-N counter integrated circuit (IC) and a D flip-flop, wherein the output from the carry-out (overflow) terminal of the divide-by-N counter IC is applied to the clock terminal of the D flip-flop with the D input terminal to receive the high level signal. In addition, the divide-by-N counter having the reset function of FIG. 5 may be selected from various custom counters. The counter may be an N-bit counter, namely, divide-by-$2^N$ counter.

What I claim as being novel is:

1. A signal sequence detection circuit for detecting the occurrence of a final signal following the occurrence of a selected sequence of K other signals, K being any positive integer of 2 or more, said circuit comprising:

K divide-by N counter means, each counter means for counting by one every time a signal is applied thereto and for generating an output signal when a count of N is reached, N being a positive integer the value of which can be independently selected for each of said K counter means; and memory means including 2K+1 address terminals and at least K+1 data output terminals, one each of K of said address terminals for receiving said K other signals respectively, another one of said address terminal for receiving said final signal, and one each of the remaining K address terminals for receiving an output signal from the K counter means respectively, one each of K of said data output terminals being coupled to said K counter means respectively for applying said signal thereto, said memory means for storing predetermined output signal patterns in each storage location in accordance with said selected sequence such that said memory means generates a first output signal on a first of said K data output terminals when a first of said K other signals is applied to a first of said K address terminals of said memory means, a second output signal on a second of said K data output terminals when a second of said K other signals is applied to a second of said K address terminals together with the application of a first output signal of said first of said K counter means is applied to the first of said remaining K address terminals, and so forth until each of said K other signals are detected its selected N times and a signal is applied to each of said remaining K address terminals from the K counter means at which time said memory means generates an output signal at the (K+1)st data output terminal upon the occurrence of said final signal.

2. A signal sequence detection circuits as in claim 1 wherein each of said K divide-by N counter means includes a final stage for latching the output signal therefrom.

3. A signal sequence detection circuit as in claim 2 wherein said final stage of each of the K counter means is a D flip-flop.

4. A signal sequence detection circuit as in claim 1 wherein said memory means is programmable to enable it to detect different signal sequences.

5. A signal sequence detection circuit as in claim 4 wherein said memory means includes a random access memory.

6. A signal sequence detection circuit as in claim 1 wherein:

each of said K counter means includes a reset terminal for restarting its count when a signal is applied thereto; and said memory means further includes a (K+2)nd data output terminal coupled to the reset terminals of all of the K counter means and said memory means generates an output signal at said (K+2)nd data output terminal whenever one of the K other signals appears on an Xth of said K address terminals before the output signal from the (X−1)st counter means is applied to the (X−1)st of said remaining K address terminals where X is a positive integer with a maximum value of K.

7. A signal sequence detection circuit for detecting the occurrence of a final signal following the occurrence of a selected sequence of at least two other signals, said circuit comprising:

memory means including at least four address terminals and at least four output data terminals, one each of three of said address terminals disposed to receive said final signal and said at least two other signals respective, said memory means for storing predetermined output signal patterns in each storage location in accordance with said selected sequence;

first and second register means for storing a preset positive integer value of M and N therein, respectively;

multiplexer means, responsive to the output signals on two of the output data terminals of the memory means, for selecting one of the integer values of M and N from the first and second register means; and counter means having its maximum count preset in response to the integer value selected by the multiplexer means and having a count advance terminal coupled to a third of the output data terminals of the memory means and an output terminal coupled to a fourth of the address terminals of the memory means, said counter means for counting the occurrences of an output signal on the third output data terminal of the memory means and generating an output signal from the counter means when the number of occurrences counted equals the preset integer value therein;

said memory means upon the receipt of a first of said two other signals on one of said three of said address terminals, wherein the first is designated by the selected sequence, generates a signal on the first of said two output data terminals of the memory means to cause the multiplexer means to select the value N, upon the occurrence of the second of said two other signals following the counter means counting of N occurrences of the first of said at least two other signals the memory means generates a signal on the second of said two output data terminals of the memory means to cause the multiplexer means to select the value M, and upon the occurrence of the final signal following the counter means counting M occurrences of the second of said at least two other signals the memory means generates a signal on the fourth output data terminal.

8. A signal sequence detection circuit as in claim 7 wherein:

said memory means further includes a fifth address terminal; and said circuit further includes latching means having its input terminal coupled to the second of said two output data terminals of the memory means and its output terminal coupled to the fifth address terminal of the memory means for triggering the resetting of the counter means to N whenever the second of said at least two other signals is applied to the memory means prior to the application and counting of N consecutive first of said at least two other signals to detect sequences without other intervening signals being applied to the memory means.

9. A signal sequence detection circuit for detecting the occurrence of a final signal following the occurrence of a selected sequence of at least two other signals, said circuit comprising:

- memory means including at least five address terminals and at least four output data terminals, one each of three of said address terminals disposed to receive said final signal and said at least two other signals respectively, said memory means for storing predetermined output signal patterns in each storage location in accordance with said selected sequence;
- first and second register means for storing a preset positive integer value of M and N therein, respectively;
- multiplexer means, responsive to the output signals on two of the output data terminals of the memory means, for selecting one of the integer values of M and N from the first and second register means;
- counter means having its maximum count preset in response to the integer value selected by the multiplexer means and having a count advance terminal coupled to a third of the output data terminals of the memory means, said counter means for counting the occurrence of an output signal on the third output data terminal of the memory means and generating an output signal from the counter means when the number of occurrences counted equals the preset integer value therein less one; and
- logic means responsive to the output signal from the counter means and the output signals from said two of the output data terminals and the third output data terminal of the memory means, said logic means being enabled by the output signal from said counter means for generating two output signals which are coupled to the fourth and fifth address terminals, respectively, of the memory means;
- said memory means upon the receipt of a first of said two other signals on one of said three of said address terminals, wherein the first is designated by the selected sequence, generates a signal on the first of said two output data terminals of the memory means to cause the multiplexer means to select the value N, upon the occurrence of the second of said two other signals following the counter means counting of N−1 occurrences of the first of said at least two other signals the memory means generates a signal on the second of said two output data terminals of the memory means to cause the multiplexer means to select the value M, and upon the occurrence of the final signal following the counter means counting M−1 occurrences of the second of said at least two other signals the memory means generates a signal on the fourth output data terminal.

* * * * *